US007233897B2

(12) United States Patent
Kapilow

(10) Patent No.: US 7,233,897 B2
(45) **Date of Patent: *Jun. 19, 2007**

(54) METHOD AND APPARATUS FOR PERFORMING PACKET LOSS OR FRAME ERASURE CONCEALMENT

(75) Inventor: David A. Kapilow, Berkeley Heights, NJ (US)

(73) Assignee: AT&T Corp., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/170,313

(22) Filed: Jun. 29, 2005

(65) Prior Publication Data

US 2005/0240402 A1 Oct. 27, 2005

(51) Int. Cl.
*G10L 19/02* (2006.01)
*H03M 13/00* (2006.01)

(52) U.S. Cl. ...................... 704/229; 704/206; 704/207; 704/228; 341/94

(58) Field of Classification Search ..................... None
See application file for complete search history.

(56) References Cited

U.S. PATENT DOCUMENTS

| | | | | |
|---|---|---|---|---|
| 5,615,298 | A | 3/1997 | Chen | 704/228 |
| 5,907,822 | A | 5/1999 | Prieto, Jr. | 704/202 |
| 6,351,730 | B2 | 2/2002 | Chen | 704/229 |

OTHER PUBLICATIONS

Perkins et al. "A Survey of Packet Loss Recovery Techniques for Streaming Audio," IEEE Network, Sep./Oct. 1998, pp. 40-48.

Stenger et al. "A New Error Concealment Technique for Audio Transmission with Packet Loss," Proc. European Signal Processing Conference, Trieste, Italy, Sep. 1996.

"Waveform Substitution Techniques for Recovering Missing Speech Segments in Packet Voice Communications," by D. J. Goodman et al., *IEEE Transactions on Acoustics, Speech and Signal Processing*, vol. ASSP-34, No. 6, pp. 1440-1448, (Dec. 1986).

"An Overlap-Add Technique Based on Waveform Similarity (WSOLA) for High Quality Time-Scale Modification of Speech," by W. Verhelst et al., *Proc. IEEE ICASSP-93*, pp. 554-557, (1993).

"The Effect of Waveform Substitution on the Quality of PCM Packet Communications," by O. J. Wasem et al., *IEEE Transactions on Acoustics, Speech and Signal Processing*, vol. 36, No. 3, pp. 342-348, (Mar. 1988).

"Pitch-Synchronous Waveform Processing Techniques for Text-to-Speech Synthesis Using Diphones," by E. Moulines et al. *Speech Communication 9*, pp. 453-467, North-Holland, (1990).

"Pulse Code Modulation (PCM) of Voice Frequencies", *ITU-T Recommendation G. 711* (Extract for the *Blue Book*) (Geneva, 1972; further amended).

(Continued)

*Primary Examiner*—V. Paul Harper

(57) ABSTRACT

The invention concerns a method and apparatus for performing packet loss or Frame Erasure Concealment (FEC) for a speech coder that does not have a built-in or standard FEC process. A receiver with a decoder receives encoded frames of compressed speech information transmitted from an encoder. A lost frame detector at the receiver determines if an encoded frame has been lost or corrupted in transmission, or erased. If the encoded frame is not erased, the encoded frame is decoded by a decoder and a temporary memory is updated with the decoder's output. A predetermined delay period is applied and the audio frame is then output. If the lost frame detector determines that the encoded frame is erased, a FEC module applies a frame concealment process to the signal. The FEC processing produces natural sounding synthetic speech for the erased frames.

13 Claims, 14 Drawing Sheets

OTHER PUBLICATIONS

"Pulse Code Modulation (PCM) of Voice Frequencies," Appendix I: A high quality low-complexity algorithm for packet loss concealment with G. 711. *ITU-T Recommendation G. 711, Appendix I* (Sep. 1999).

"Pulse Code Modulation (PCM) of Voice Frequencies," Appendix II: A comfort noise payload definition for ITU-T G. 711 use in packet-based multimedia communication systems, *ITU-T Recommendation G. 711- Appendix II*, (Feb. 2000).

"Dual Rate Speech Coder for Multimedia Communications Transmitting at 5.3 and 6.3 kbit/s", *ITU-T Recommendation G. 723.1*, (Geneva, Mar. 1996).

"40, 32, 24, 16 kbit/s Adaptive Differential Pulse Code Modulation (ADPCM)" *CCITT Recommendation G. 726*, (Geneva, 1990).

"Coding of Speech at 16 kbit/s Using Low-Delay Code Excited Linear Prediction", *CCITT Recommendation G. 728*, (Geneva, 1992).

"Programs and Test Sequences for Implementation Verification of the Algorithm of the G. 728 16 kbit/s LD-CELP Speech Coder", G. 728 Appendix 1: Verification tools, *ITU-T Recommendation G. 728 Appendix I* (Jul. 1995).

"Speech Performance", Appendix II, Rec. G. 728, *Appendix II to ITU-T Recommendation G. 728* (Nov. 1995).

"Coding of Speech at 16 kbit/s Using Low-Delay Code Excited Linear Prediction", Annex G: 16 kbit/s fixed point specification, Corrigendum 1 *ITU-T Recommendation G. 728—Annex G—Corrigendum 1* (Feb. 2000).

"Coding of Speech at 16 kbit/s Using Low-Delay Code Excited Linear Prediction", Annex H: Variable bit rate LD-CELP operation mainly for DCME at rates less than 16 kbit/s, *ITU-T Recommendation G. 728—Annex H* (May 1999).

"Coding of Speech at 16 kbit/s Using Low-Delay Code Excited Linear Prediction", Annex I: Frame or packet loss concealment for the LD-CELP decoder *ITU-T Recommendation G. 728—Annex I* (May 1999).

"Coding of Speech at 16 kbit/s Using Low-Delay Code Excited Linear Prediction", Annex J: Variable bit-rate operation of LD-CELP mainly for voiceband-data applications in DCME, *ITU -T Recommendation G. 728—Annex J* (Sep. 1999).

"Coding of Speech at 8 kbit/s Using Conjugate-Structure Algebraic-Code-Excited Linear-Prediction (CS-ACELP)", *ITU-T Recommendation G. 729* (Geneva, (Mar. 1996).

Lara-Barron M. M. et al, "Missing Packet Recovery of Low-Bit Coded Speech Using A Novel Packet-based Embedeed Coder", Signal Processing V. Theories and Applications, Proceedings of the EUSIPCO-90, Barcelona, Spain, Sep. 18-21, 1990, pp. 1115-1118.

METHOD AND APPARATUS FOR PERFORMING PACKET LOSS OR FRAME ERASURE CONCEALMENT

This non-provisional application claims the benefit of U.S. Provisional Application 60/130,016, filed Apr. 19, 1999, the subject matter of which is incorporated herein by reference. The following documents are also incorporated by reference herein: ITU-T Recommendation G.711—Appendix I, "A high quality low complexity algorithm for packet loss concealment with G.711" (September 1999) and American National Standard for Telecommunications—Packet Loss Concealment for Use with ITU-T Recommendation G.711 (T1.521-1999).

BACKGROUND OF THE INVENTION

1. Field of Invention

This invention relates to performing packet loss or Frame Erasure Concealment (FEC), and in particular, for performing FEC using speech coder that do not have a built-in or standard FEC, such as the G.711 speech coder.

2. Description of Related Art

Packet loss or Frame Erasure Concealment (FEC) techniques hide transmission losses in an audio system where the input signal is encoded and packetized at a transmitter, sent over a network, and received at a receiver that decodes the frame and plays out the output. While many of the standard Code-Excited Linear Prediction (CELP)-based speech coders, such as ITU-T's G.723.1, G.728, and G.729 have FEC algorithms built-in or proposed in their standards, there is currently no such standard for G.711, for example.

SUMMARY OF THE INVENTION

The invention concerns a method and apparatus for performing packet loss or Frame Erasure Concealment (FEC) for a speech coder that does not have a built-in or standard FEC process. A receiver with a decoder receives encoded frames of compressed speech information transmitted from an encoder. A lost frame detector at the receiver determines if an encoded frame has been lost or corrupted in transmission, or erased. If the encoded frame is not erased, the encoded frame is decoded by a decoder and a temporary memory is updated with the decoder's output. A predetermined delay period is applied and the audio frame is then output.

If the lost frame detector determines that the encoded frame is erased, a FEC module applies a frame concealment process to the signal. The FEC processing produces natural sounding synthetic speech for the erased frames.

SUMMARY OF THE INVENTION

The invention concerns a method and apparatus for performing packet loss or Frame Erasure Concealment (FEC) for a speech coding system process. When an encoded frame is erased, a frame concealment process is applied to the signal. This process employs a replication of pitch waveforms to synthesize missing speech, but unlike the prior art, the process replicates a number of pitch waveforms which number increases with the length of the erasure. This FEC processing produces an advance in the art by creating natural sounding synthetic speech for the erased frames.

BRIEF DESCRIPTION OF THE DRAWINGS

The invention is described in detail with reference to the following figures, wherein like numerals reference like elements, and wherein.

DETAILED DESCRIPTION OF PREFERRED EMBODIMENTS

Recently there has been much interest in using G.711 on packet networks without guaranteed quality of service to support Plain-Old-Telephony Service (POTS). When frame erasures (or packet losses) occur on these networks, concealment techniques are needed or the quality of the call is seriously degraded. A high-quality, low complexity Frame Erasure Concealment (FEC) technique has been developed and is described in detail below.

Figure 1:
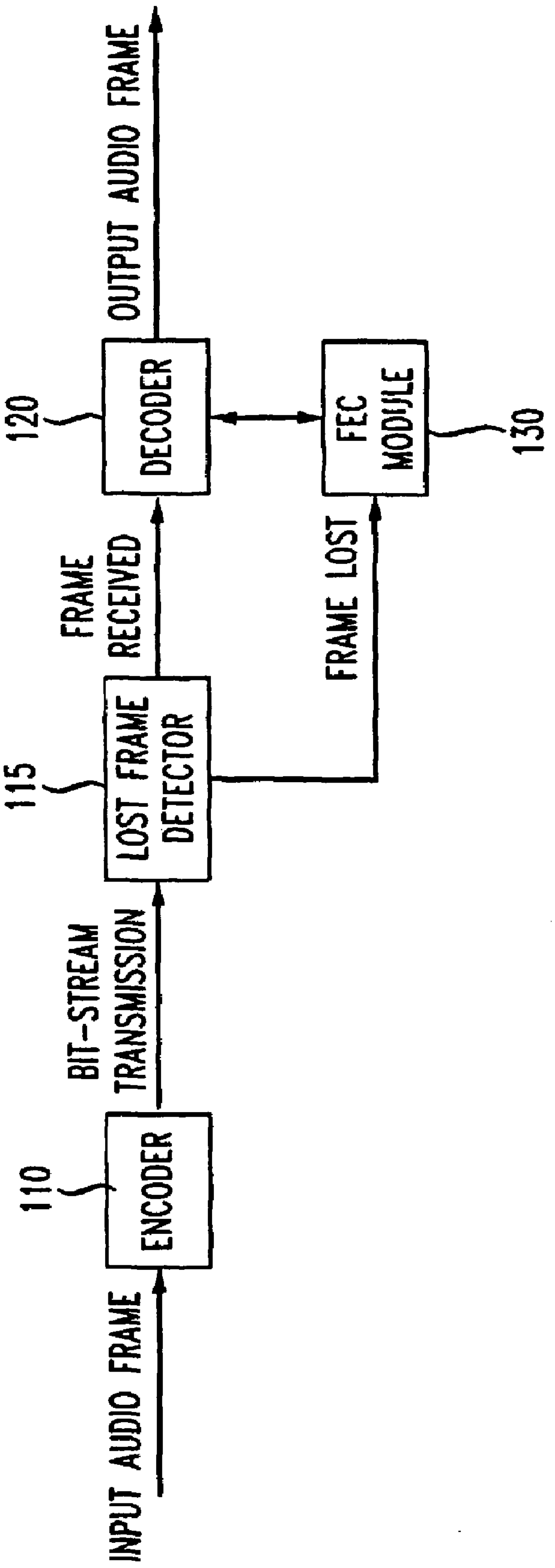
FIG. 1 is an exemplary audio transmission system.

An exemplary block diagram of an audio system with FEC is shown in FIG. 1. In FIG. 1, an encoder 110 receives an input audio frame and outputs a coded bit-stream. The bit-stream is received by the lost frame detector 115 which determines whether any frames have been lost. If the lost frame detector 115 determines that frames have been lost, the lost frame detector 115 signals the FEC module 130 to apply an FEC algorithm or process to reconstruct the missing frames.

Thus, the FEC process hides transmission losses in an audio system where the input signal is encoded and packetized at a transmitter, sent over a network, and received at a lost frame detector 115 that determines that a frame has been lost. It is assumed in FIG. 1 that the lost frame detector 115 has a way of determining if an expected frame does not arrive, or arrives too late to be used. On IP networks this is normally implemented by adding a sequence number or timestamp to the data in the transmitted frame. The lost frame detector 115 compares the sequence numbers of the arriving frames with the sequence numbers that would be expected if no frames were lost. If the lost frame detector 115 detects that a frame has arrived when expected, it is decoded by the decoder 120 and the output frame of audio is given to the output system. If a frame is lost, the FEC module 130 applies a process to hide the missing audio frame by generating a synthetic frame's worth of audio instead.

Many of the standard ITU-T CELP-based speech coders, such as the G.723.1, G.728, and G.729, model speech reproduction in their decoders. Thus, the decoders have enough state information to integrate the FEC process directly in the decoder. These speech coders have FEC algorithms or processes specified as part of their standards.

G.711, by comparison, is a sample-by-sample encoding scheme that does not model speech reproduction. There is no state information in the coder to aid in the FEC. As a result, the FEC process with G.711 is independent of the coder.

Figure 2:
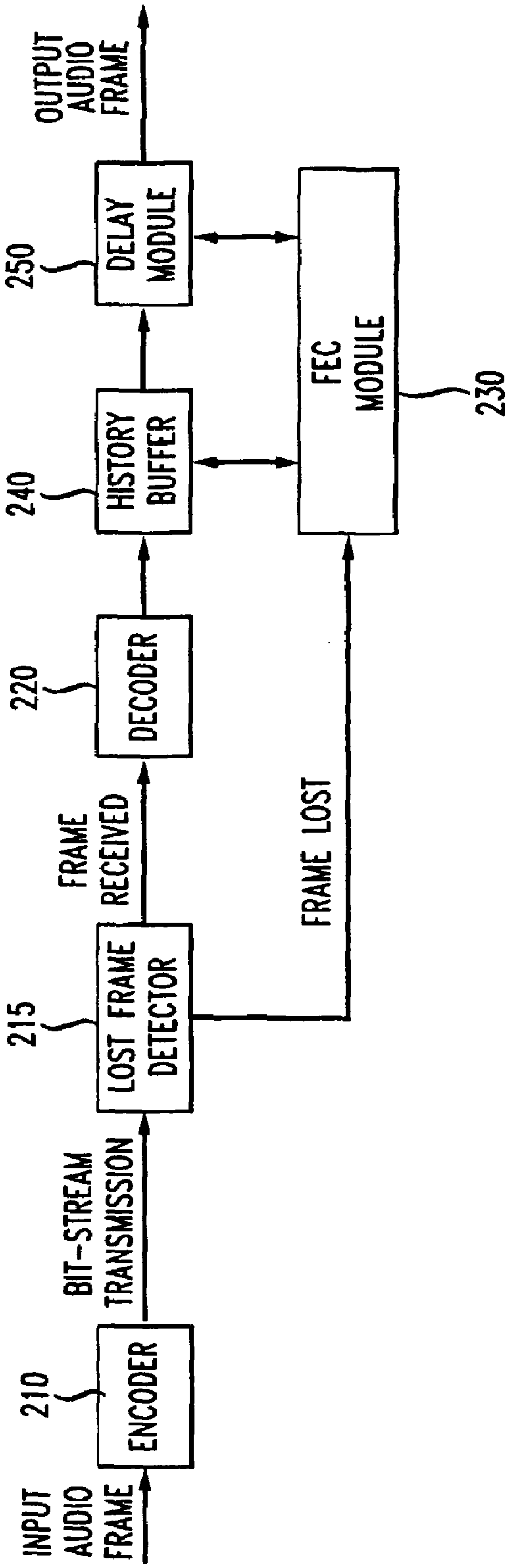
FIG. 2 is an exemplary audio transmission system with a G.711 coder and FEC module.

An exemplary block diagram of the system as used with the G.711 coder is shown in FIG. 2. As in FIG. 1, the G.711 encoder 210 encodes and transmits the bit-stream data to the lost frame detector 215. Again, the lost frame detector 215 compares the sequence numbers of the arriving frames with the sequence numbers that would be expected if no frames were lost. If a frame arrives when expected, it is forwarded for decoding by the decoder 220 and then output to a history buffer 240, which stores the signal. If a frame is lost, the lost frame detector 215 informs the FEC module 230 which applies a process to hide the missing audio frame by generating a synthetic frame's worth of audio instead.

However, to hide the missing frames, the FEC module 230 applies a G.711 FEC process that uses the past history of the decoded output signal provided by the history buffer 240 to estimate what the signal should be in the missing frame. In addition, to insure a smooth transition between erased and non-erased frames, a delay module 250 also delays the output of the system by a predetermined time period, for example, 3.75 msec. This delay allows the synthetic erasure signal to be slowly mixed in with the real output signal at the beginning of an erasure.

The arrows between the FEC module 230 and each of the history buffer 240 and the delay module 250 blocks signify that the saved history is used by the FEC process to generate the synthetic signal. In addition, the output of the FEC module 230 is used to update the history buffer 240 during an erasure. It should be noted that, since the FEC process only depends on the decoded output of G.711, the process will work just as well when no speech coder is present.

Figure 3:
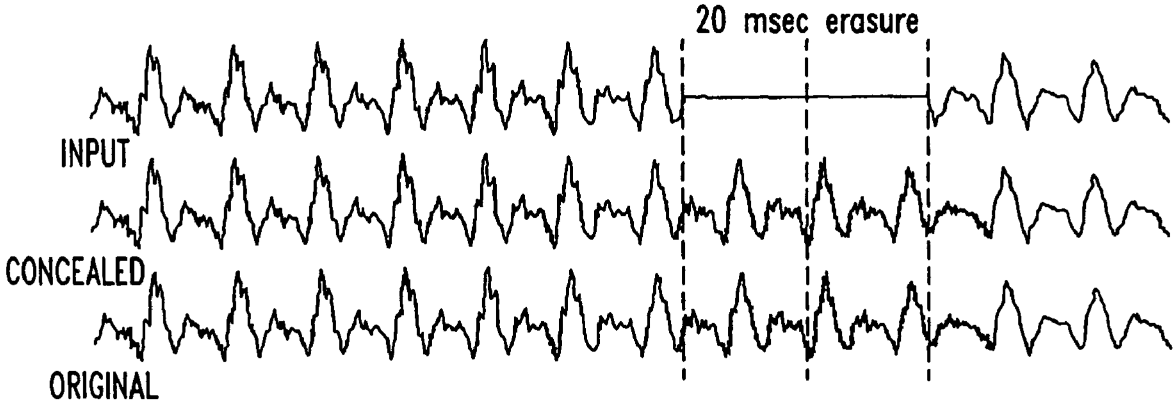
FIG. 3 illustrates an output audio signal using an FEC technique.

A graphical example of how the input signal is processed by the FEC process in FEC module 230 is shown in FIG. 3.

The top waveform in the figure shows the input to the system when a 20 msec erasure occurs in a region of voiced speech from a male speaker. In the waveform below it, the FEC process has concealed the missing segments by generating synthetic speech in the gap. For comparison purposes, the original input signal without an erasure is also shown. In an ideal system, the concealed speech sounds just like the original. As can be seen from the figure, the synthetic waveform closely resembles the original in the missing segments. How the "Concealed" waveform is generated from the "Input" waveform is discussed in detail below.

The FEC process used by the FEC module 230 conceals the missing frame by generating synthetic speech that has similar characteristics to the speech stored in the history buffer 240. The basic idea is as follows. If the signal is voiced, we assume the signal is quasi-periodic and locally stationary. We estimate the pitch and repeat the last pitch period in the history buffer 240 a few times. However, if the erasure is long or the pitch is short (the frequency is high), repeating the same pitch period too many times leads to output that is too harmonic compared with natural speech. To avoid these harmonic artifacts that are audible as beeps and bongs, the number of pitch periods used from the history buffer 240 is increased as the length of the erasure progresses. Short erasures only use the last or last few pitch periods from the history buffer 240 to generate the synthetic signal. Long erasures also use pitch periods from further back in the history buffer 240. With long erasures, the pitch periods from the history buffer 240 are not replayed in the same order that they occurred in the original speech. However, testing found that the synthetic speech signal generated in long erasures still produces a natural sound.

The longer the erasure, the more likely it is that the synthetic signal will diverge from the real signal. To avoid artifacts caused by holding certain types of sounds too long, the synthetic signal is attenuated as the erasure becomes longer. For erasures of duration 10 msec or less, no attenuation is needed. For erasures longer than 10 msec, the synthetic signal is attenuated at the rate of 20% per additional 10 msec. Beyond 60 msec, the synthetic signal is set to zero (silence). This is because the synthetic signal is so dissimilar to the original signal that on average it does more harm than good to continue trying to conceal the missing speech after 60 msec.

Whenever a transition is made between signals from different sources, it is important that the transition not introduce discontinuities, audible as clicks, or unnatural artifacts into the output signal. These transitions occur in several places:

1. At the start of the erasure at the boundary between the start of the synthetic signal and the tail of last good frame.
2. At the end of the erasure at the boundary between the synthetic signal and the start of the signal in the first good frame after the erasure.
3. Whenever the number of pitch periods used from the history buffer 240 is changed to increase the signal variation.
4. At the boundaries between the repeated portions of the history buffer 240.

To insure smooth transitions, Overlap Adds (OLA) are performed at all signal boundaries. OLAs are a way of smoothly combining two signals that overlap at one edge. In the region where the signals overlap, the signals are weighted by windows and then added (mixed) together. The windows are designed so the sum of the weights at any particular sample is equal to 1. That is, no gain or attenuation is applied to the overall sum of the signals. In addition, the windows are designed so the signal on the left starts out at weight 1 and gradually fades out to 0, while the signal on the right starts out at weight 0 and gradually fades in to weight 1. Thus, in the region to the left of the overlap window, only the left signal is present while in the region to the right of the overlap window, only the right signal is present. In the overlap region, the signal gradually makes a transition from the signal on left to that on the right. In the FEC process, triangular windows are used to keep the complexity of calculating the variable length windows low, but other windows, such as Hanning windows, can be used instead.

Figure 4:
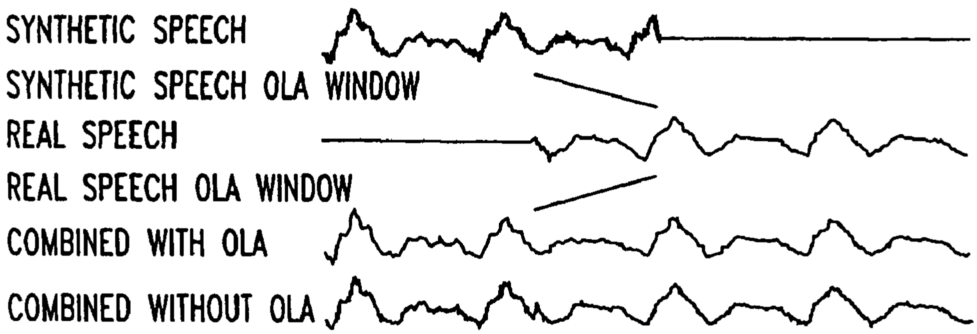
FIG. 4 illustrates an overlap-add (OLA) operation at the end of an erasure.

FIG. 4 shows the synthetic speech at the end of a 20-msec erasure being OLAed with the real speech that starts after the erasure is over. In this example, the OLA weighting window is a 5.75 msec triangular window. The top signal is the synthetic signal generated during the erasure, and the overlapping signal under it is the real speech after the erasure. The OLA weighting windows are shown below the signals. Here, due to a pitch change in the real signal during the erasure, the peaks of the synthetic and real signals do not match up, and the discontinuity introduced if we attempt to combine the signals without an OLA is shown in the graph labeled "Combined Without OLA". The "Combined Without OLA" graph was created by copying the synthetic signal up until the start of the OLA window, and the real signal for the duration. The result of the OLA operations shows how the discontinuities at the boundaries are smoothed.

The previous discussion concerns how an illustrative process works with stationary voiced speech, but if the speech is rapidly changing or unvoiced, the speech may not have a periodic structure. However, these signals are processed the same way, as set forth below.

First, the smallest pitch period we allow in the illustrative embodiment in the pitch estimate is 5 msec, corresponding to frequency of 200 Hz. While it is known that some high-frequency female and child speakers have fundamental frequencies above 200 Hz, we limit it to 200 Hz so the windows stay relatively large. This way, within a 10 msec erased frame the selected pitch period is repeated a maximum of twice. With high-frequency speakers, this doesn't really degrade the output, since the pitch estimator returns a multiple of the real pitch period. And by not repeating any speech too often, the process does not create synthetic periodic speech out of non-periodic speech. Second, because the number of pitch periods used to generate the synthetic speech is increased as the erasure gets longer, enough variation is added to the signal that periodicity is not introduced for long erasures.

It should be noted that the Waveform Similarity Overlap Add (WSOLA) process for time scaling of speech also uses large fixed-size OLA windows so the same process can be used to time-scale both periodic and non-periodic speech signals.

While an overview of the illustrative FEC process was given above, the individual steps will be discussed in detail below.

For the purpose of this discussion, we will assume that a frame contains 10 msecs of speech and the sampling rate is 8 kHz, for example. Thus, erasures can occur in increments of 80 samples (8000*0.010=80). It should be noted that the FEC process is easily adaptable to other frame sizes and sampling rates. To change the sampling rate, just multiply the time periods given in msec by 0.001, and then by the sampling rate to get the appropriate buffer sizes. For example, the history buffer 240 contains the last 48.75 msec of speech. At 8 kHz this would imply the buffer is (48.75*0.001*8000)=390 samples long. At 16 kHz sampling, it would be double that, or 780 samples.

Several of the buffer sizes are based on the lowest frequency the process expects to see. For example, the illustrative process assumes that the lowest frequency that will be seen at 8 kHz sampling is 66⅔ Hz. That leads to a maximum pitch period of 15 msec (1/(66⅔)=0.015). The length of the history buffer 240 is 3.25 times the period of the lowest frequency. So the history buffer 240 is thus 15*3.25=48.75 msec. If at 16 kHz sampling the input filters allow frequencies as low as 50 Hz (20 msec period), the history buffer 240 would have to be lengthened to 20*3.25=65 msecs.

The frame size can also be changed; 10 msec was chosen as the default since it is the frame size used by several standard speech coders, such as G.729, and is also used in several wireless systems. Changing the frame size is straightforward. If the desired frame size is a multiple of 10 msec, the process remains unchanged. Simply leave the erasure process' frame size at 10 msec and call it multiple times per frame. If the desired packet frame size is a divisor of 10 msec, such as 5 msec, the FEC process basically remains unchanged. However, the rate at which the number of periods in the pitch buffer is increased will have to be modified based on the number of frames in 10 msec. Frame sizes that are not multiples or divisors of 10 msec, such as 12 msec, can also be accommodated. The FEC process is reasonably forgiving in changing the rate of increase in the number of pitch periods used from the pitch buffer. Increasing the number of periods once every 12 msec rather than once every 10 msec will not make much of a difference.

Figure 5:
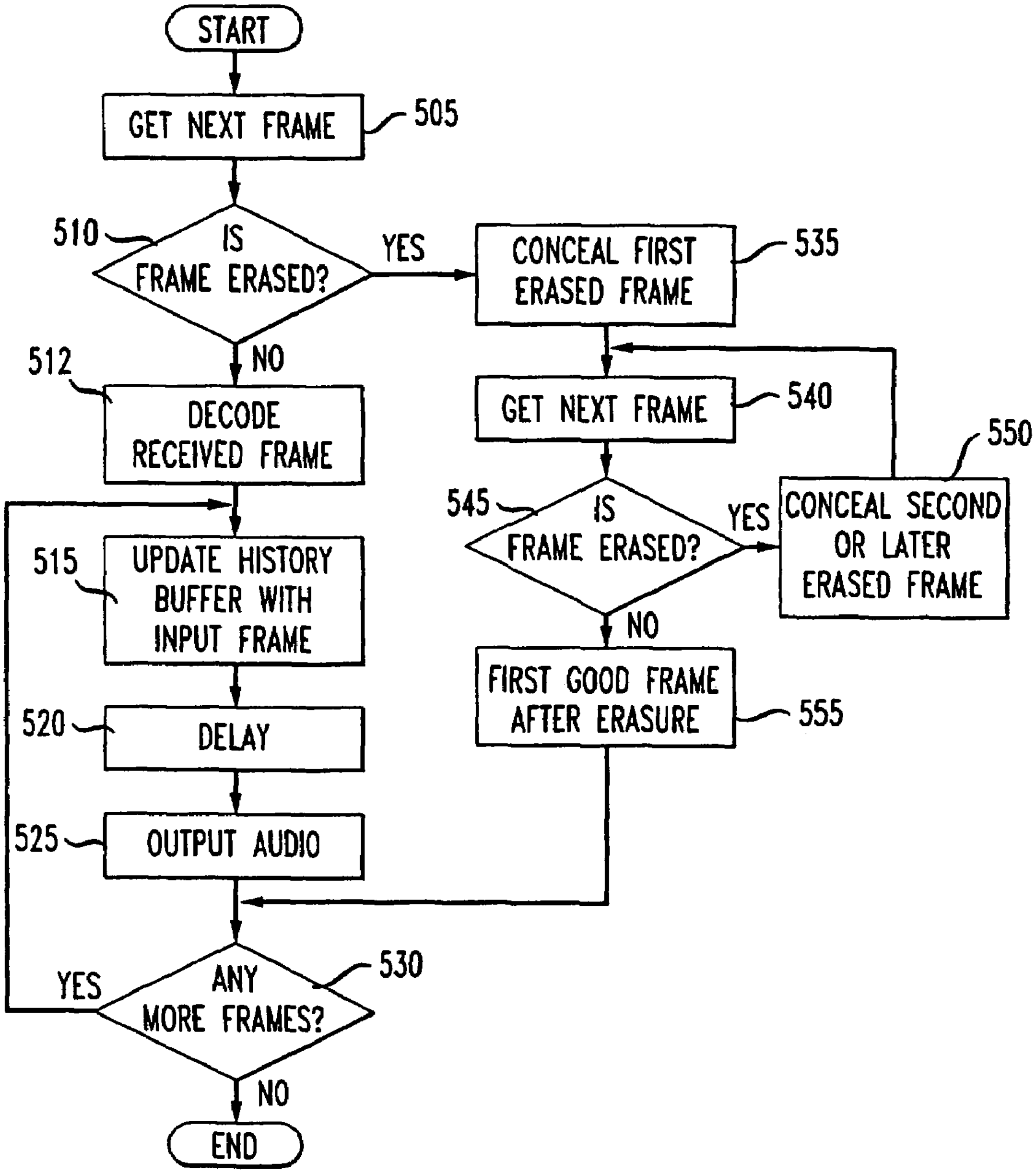
FIG. 5 is a flowchart of an exemplary process for performing FEC using a G.711 coder.

FIG. 5 is a block diagram of the FEC process performed by the illustrative embodiment of FIG. 2. The sub-steps needed to implement some of the major operations are further detailed in FIGS. 7, 12, and 16, and discussed below. In the following discussion several variables are used to hold values and buffers. These variables are summarized below:

TABLE 1

Variables and Their Contents

| Variable | Type | Description | Comment |
|---|---|---|---|
| B | Array | Pitch Buffer | Range[−P*3.25:−1] |
| H | Array | History Buffer | Range[−390:−1] |
| L | Array | Last ¼ Buffer | Range[−P*.25:−1] |
| O | Scalar | Offset in Pitch Buffer | |
| P | Scalar | Pitch Estimate | 40 <= P < 120 |
| P4 | Scalar | ¼ Pitch Estimate | P4 = P >> 2 |
| S | Array | Synthesized Speech | Range[0:79] |
| U | Scalar | Used Wavelengths | 1 <= U <= 3 |

As shown in the flowchart in FIG. 5, the process begins and at step 505, the next frame is received by the lost frame detector 215. In step 510, the lost frame detector 215 determines whether the frame is erased. If the frame is not erased, in step 512 the frame is decoded by the decoder 220. Then, in step 515, the decoded frame is saved in the history buffer 240 for use by the FEC module 230.

Figure 6:
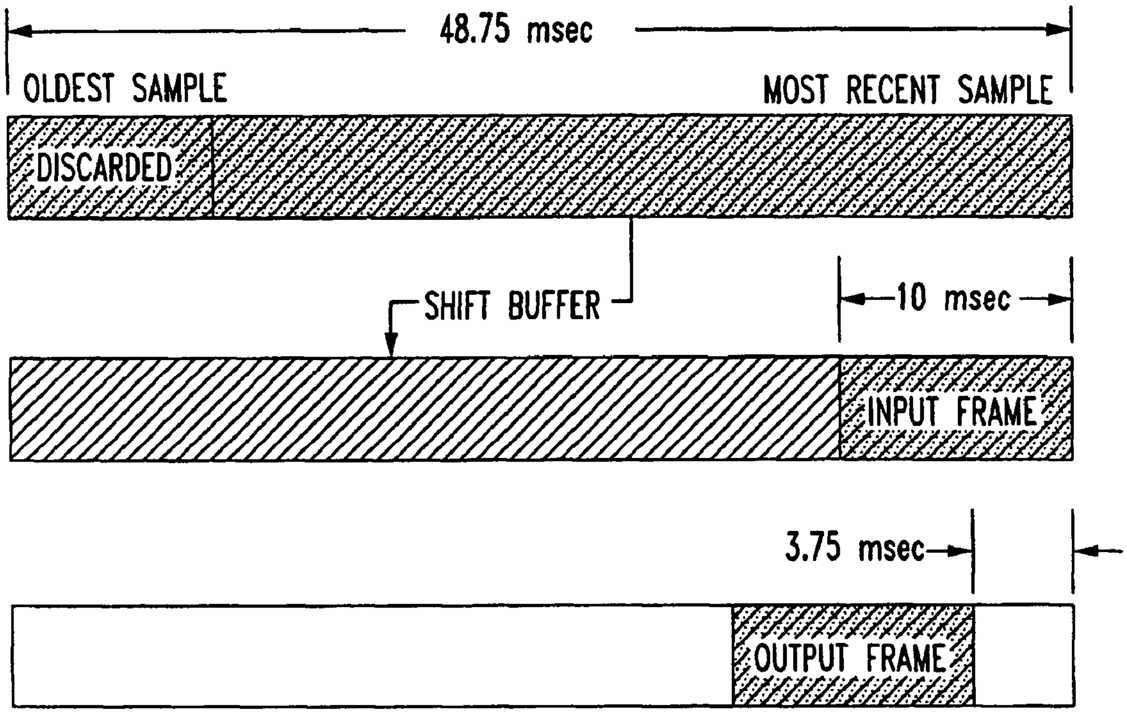
FIG. 6 is a graph illustrating the updating process of the history buffer.

In the history buffer updating step, the length of this buffer 240 is 3.25 times the length of the longest pitch period expected. At 8 KHz sampling, the longest pitch period is 15 msec, or 120 samples, so the length of the history buffer 240 is 48.75 msec, or 390 samples. Therefore, after each frame is decoded by the decoder 220, the history buffer 240 is updated so it contains the most recent speech history. The updating of the history buffer 240 is shown in FIG. 6. As shown in this Fig., the history buffer 240 contains the most recent speech samples on the right and the oldest speech samples on the left. When the, newest frame of the decoded speech is received, it is shifted into the buffer 240 from the right, with the samples corresponding to the oldest speech shifted out of the buffer on the left (see **6*b***).

In addition, in step 520 the delay module 250 delays the output of the speech by ¼ of the longest pitch period. At 8 KHz sampling, this is 120*¼=30 samples, or 3.75 msec. This delay allows the FEC module 230 to perform a ¼ wavelength OLA at the beginning of an erasure to insure a smooth transition between the real signal before the erasure and the synthetic signal created by the FEC module 230. The output must be delayed because after decoding a frame, it is not known whether the next frame is erased.

In step 525, the audio is output and, at step 530, the process determines if there are any more frames. If there are no more frames, the process ends. If there are more frames, the process goes back to step 505 to get the next frame.

However, if in step 510 the lost frame detector 215 determines that the received frame is erased, the process goes to step 535 where the FEC module 230 conceals the first erased frame, the process of which is described in detail below in FIG. 7. After the first frame is concealed, in step 540, the lost frame detector 215 gets the next frame. In step 545, the lost frame detector 215 determines whether the next frame is erased. If the next frame is not erased, in the step 555, the FEC module 230 processes the first frame after the erasure, the process of which is described in detail below in FIG. 16. After the first frame is processed, the process returns to step 530, where the lost frame detector 215 determines whether there are any more frames.

Figure 12:
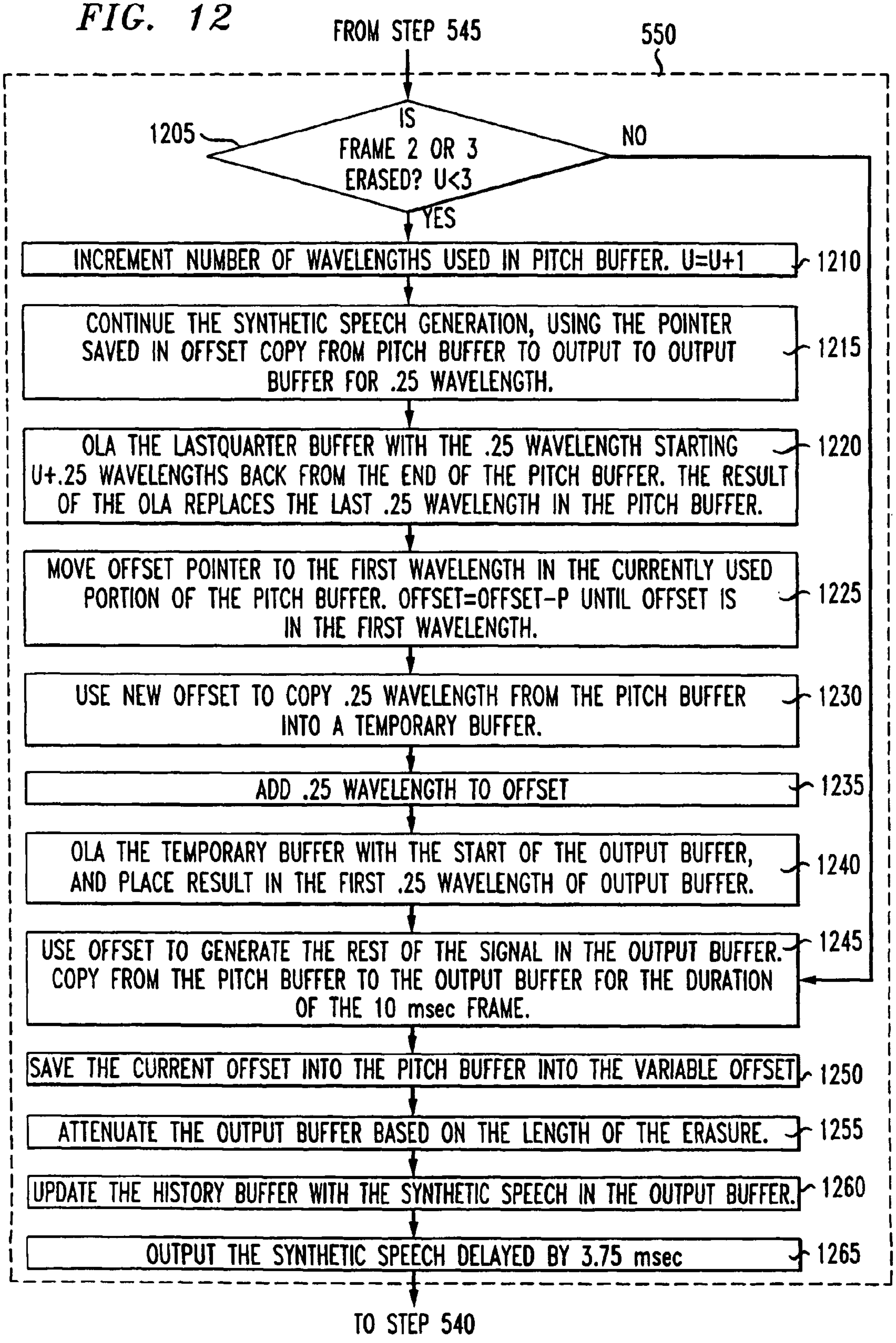
FIG. 12 is a flowchart of an exemplary process to conceal the second or later erased frame of the signal.

If, in step 545, the lost frame detector 215 determines that the next or subsequent frames are erased, the FEC module 230 conceals the second and subsequent frames according to a process which is described in detail below in FIG. 12.

Figure 7:
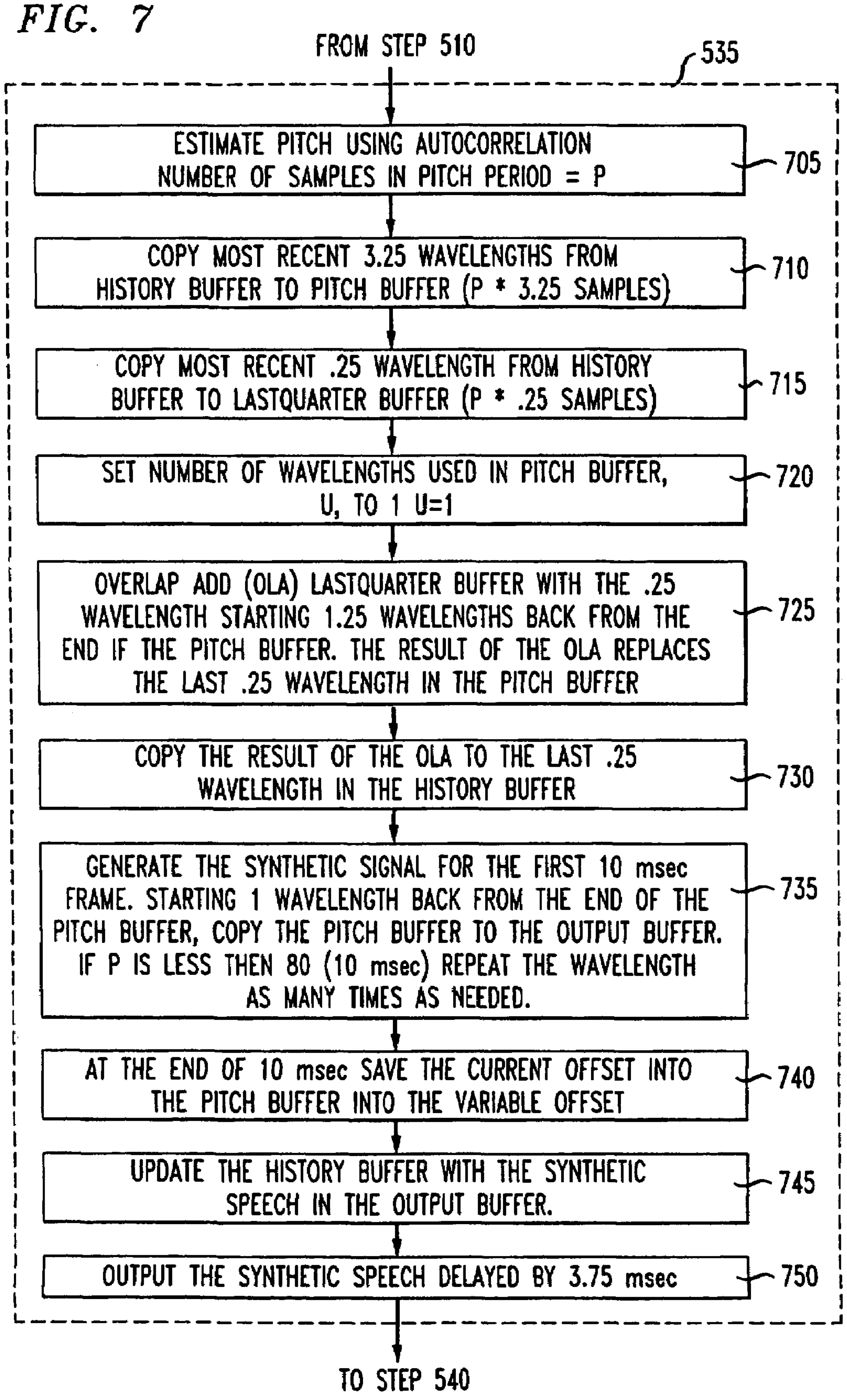
FIG. 7 is a flowchart of an exemplary process to conceal the first frame of the signal.

FIG. 7 details the steps that are taken to conceal the first 10 msecs of an erasure. The steps are examined in detail below.

As can be seen in FIG. 7, in step 705, the first operation at the start of an erasure is to estimate the pitch. To do this, a normalized auto-correlation is performed on the history buffer 240 signal with a 20 msec (160 sample) window at tap delays from 40 to 120 samples. At 8 KHz sampling these delays correspond to pitch periods of 5 to 15 msec, or fundamental frequencies from 200 to 66⅔ Hz. The tap at the peak of the auto-correlation is the pitch estimate P. Assuming H contains this history, and is indexed from −1 (the sample right before the erasure) to −390 (the sample 390 samples before the erasure begins), the auto correlation for tap j can be expressed mathematically as:

$$Autocor(j) = \frac{\sum_{i=1}^{160} H[-i]H[-i-j]}{\sqrt{\sum_{k=1}^{160} H^2[-k-j]}}$$

The peak of the auto-correlation, or the pitch estimate, can than be expressed as:

$$P=\{\max_j(\text{Autocor}(j))|40\leqq j\leqq 120\}$$

As mentioned above, the lowest pitch period allowed, 5 msec or 40 samples, is large enough that a single pitch period is repeated a maximum of twice in a 10 msec erased frame. This avoids artifacts in non-voiced speech, and also avoids unnatural harmonic artifacts in high-pitched speakers.

Figure 8:
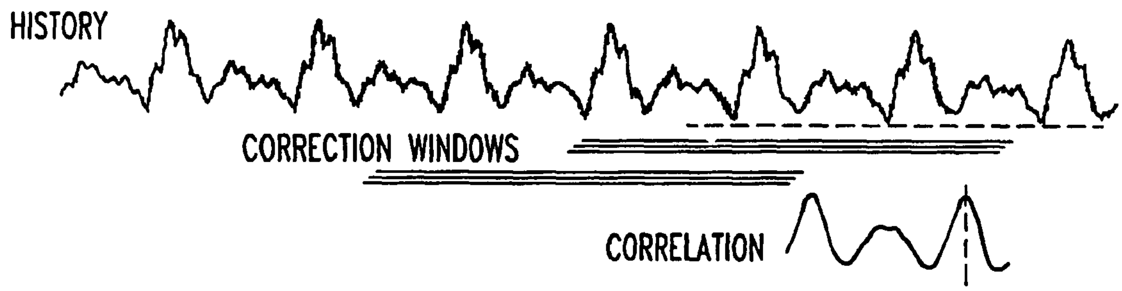
FIG. 8 illustrates the pitch estimate from auto-correlation.

A graphical example of the calculation of the normalized auto-correlation for the erasure in FIG. 3 is shown in FIG. 8.

The waveform labeled "History" is the contents of the history buffer 240 just before the erasure. The dashed horizontal line shows the reference part of the signal, the history buffer 240 H[−1]:H[−160], which is the 20 msec of speech just before the erasure. The solid horizontal lines are the 20 msec windows delayed at taps from 40 samples (the top line, 5 msec period, 200 Hz frequency) to 120 samples (the bottom line, 15 msec period, 66.66 Hz frequency). The output of the correlation is also plotted aligned with the locations of the windows. The dotted vertical line in the correlation is the peak of the curve and represents the estimated pitch. This line is one period back from the start of the erasure. In this case, P is equal to 56 samples, corresponding to a pitch period of 7 msec, and a fundamental frequency of 142.9 Hz.

To lower the complexity of the auto-correlation, two special procedures are used. While these shortcuts don't significantly change the output, they have a big impact on the process' overall run-time complexity. Most of the complexity in the FEC process resides in the auto-correlation.

First, rather than computing the correlation at every tap, a rough estimate of the peak is first determined on a decimated signal, and then a fine search is performed in the vicinity of the rough peak. For the rough estimate we modify the Autocor function above to the new function that works on a 2:1 decimated signal and only examines every other tap:

$$Autocor_{rough}(j) = \frac{\sum_{i=1}^{80} H[-2i]H[-2i-j]}{\sqrt{\sum_{k=1}^{80} H^2[-2k-j]}}$$

$$P_{rough} = 2\{\max_j(Autocor_{rough}(2j)) \mid 20 \leq j \leq 60\}$$

Figure 9:
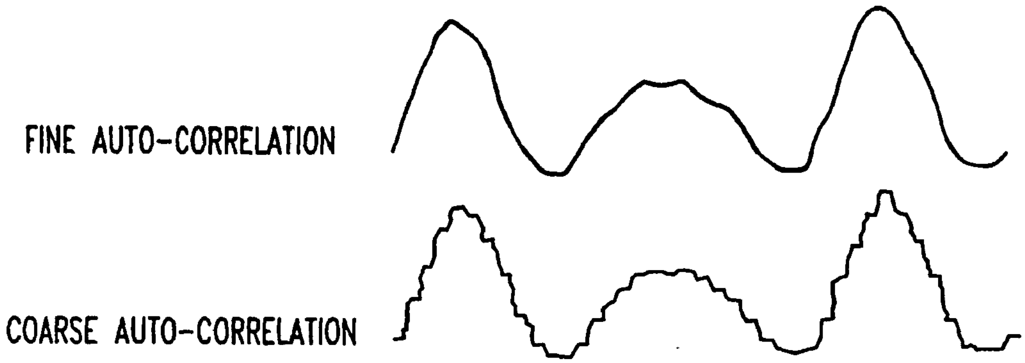
FIG. 9 illustrates fine vs. coarse pitch estimates.

Then using the rough estimate, the original search process is repeated, but only in the range $P_{rough}-1\leqq j\leqq P_{rough}+1$. Care is taken to insure j stays in the original range between 40 and 120 samples. Note that if the sampling rate is increased, the decimation factor should also be increased, so the overall complexity of the process remains approximately constant. We have performed tests with decimation factors of 8:1 on speech sampled at 44.1 KHz and obtained good results. FIG. 9 compares the graph of the $\text{Autocor}_{rough}$ with that of Autocor. As can be seen in the figure, $\text{Autocor}_{rough}$ is a good approximation to Autocor and the complexity decreases by almost a factor of 4 at 8 KHz sampling—a factor of 2 because only every other tap is examined and a factor of 2 because, at a given tap, only every other sample is examined.

The second procedure is performed to lower the complexity of the energy calculation in Autocor and $\text{Autocor}_{rough}$. Rather than computing the full sum at each step, a running sum of the energy is maintained. That is, let:

$$\text{Energy}(j) = \sum_{k=1}^{160} H^2[-k-j]$$

then:

$$\text{Energy}(j+1) = \sum_{k=1}^{160} H^2[-k-j-1]$$
$$= \text{Energy}(j) + H^2[-j-161] - H^2[-j-1]$$

So only 2 multiples and 2 adds are needed to update the energy term at each step of the FEC process after the first energy term is calculated.

Now that we have the pitch estimate, P, the waveform begins to be generated during the erasure. Returning to the flowchart in FIG. 7, in step 710, the most recent 3.25 wavelengths (3.25*P samples) are copied from the history buffer 240, H, to the pitch buffer, B. The contents of the pitch buffer, with the exception of the most recent ¼ wavelength, remain constant for the duration of the erasure. The history buffer 240, on the other hand, continues to get updated during the erasure with the synthetic speech.

In step 715, the most recent ¼ wavelength (0.25*P samples) from the history buffer 240 is saved in the last quarter buffer, L. This ¼ wavelength is needed for several of the OLA operations. For convenience, we will use the same negative indexing scheme to access the B and L buffers as we did for the history buffer 240. B[−1] is last sample before the erasure arrives, B[−2] is the sample before that, etc. The synthetic speech will be placed in the synthetic buffer S, that is indexed from 0 on up. So S[0] is the first synthesized sample, S[1] is the second, etc.

Figure 10:
FIG. 10 illustrates signals in the pitch and lastquarter buffers.

The contents of the pitch buffer, B, and the last quarter buffer, L, for the erasure in FIG. 3 are shown in FIG. 10. In the previous section, we calculated the period, P, to be 56 samples. The pitch buffer is thus 3.25*56=182 sample long. The last quarter buffer is 0.25*56=14 samples long. In the figure, vertical lines have been placed every P samples back from the start of the erasure.

During the first 10 msec of an erasure, only the last pitch period from the pitch buffer is used, so in step 720, U=1. If the speech signal was truly periodic and our pitch estimate wasn't an estimate, but the exact true value, we could just copy the waveform directly from the pitch buffer, B, to the synthetic buffer, S, and the synthetic signal would be smooth and continuous. That is, S[0]=B[−P], S[1]=B[−P+1], etc. If the pitch is shorter than the 10 msec frame, that is P<80, the single pitch period is repeated more than once in the erased frame. In our example P=56 so the copying rolls over at S[56]. The sample-by-sample copying sequence near sample 56 would be: S[54]=B[−2], S[55]=B[−1], S[56]=B[−56], S[57]=B[−55], etc.

In practice the pitch estimate is not exact and the signal may not be truly periodic. To avoid discontinuities (a) at the boundary between the real and synthetic signal, and (b) at the boundary where the period is repeated, OLAs are required. For both boundaries we desire a smooth transition from the end of the real speech, B[−1], to the speech one period back, B[−P]. Therefore, in step 725, this can be accomplished by overlap adding (OLA) the ¼ wavelength before B[−P] with the last ¼ wavelength of the history buffer 240, or the contents of L. Graphically, this is equivalent to taking the last 1¼ wavelengths in the pitch buffer, shifting it right one wavelength, and doing an OLA in the ¼ wavelength overlapping region. In step 730, the result of the OLA is copied to the last ¼ wavelength in the history buffer 240. To generate additional periods of the synthetic waveform, the pitch buffer is shifted additional wavelengths and additional OLAs are performed.

Figure 11:
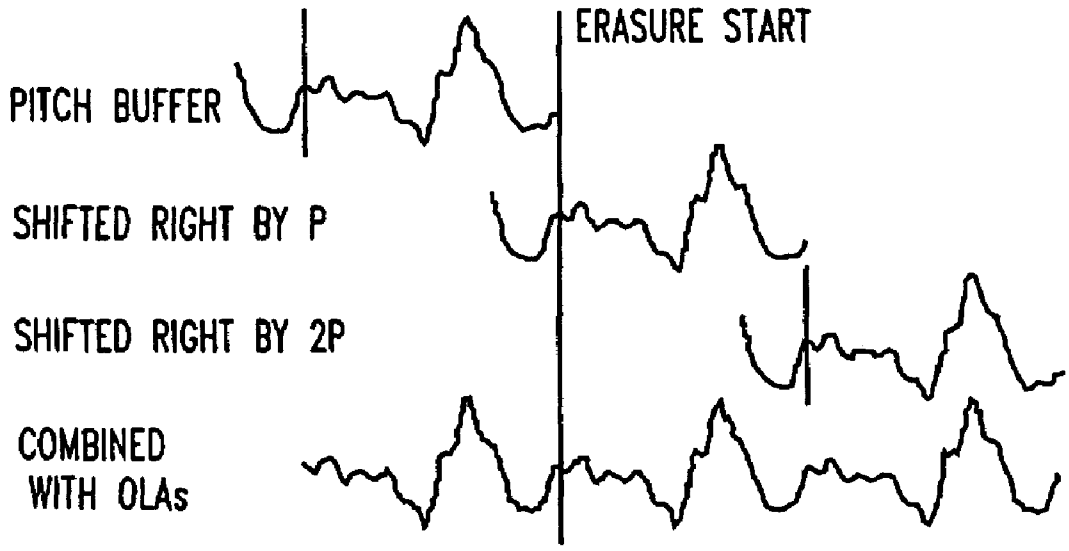
FIG. 11 illustrates synthetic signal generation using a single-period pitch buffer.

FIG. 11 shows the OLA operation for the first 2 iterations. In this figure the vertical line that crosses all the waveforms is the beginning of the erasure. The short vertical lines are pitch markers and are placed P samples from the erasure boundary. It should be observed that the overlapping region between the waveforms "Pitch Buffer" and "Shifted right by P" correspond to exactly the same samples as those in the overlapping region between "Shifted right by P" and "Shifted right by 2P". Therefore, the ¼ wavelength OLA only needs to be computed once.

In step 735, by computing the OLA first and placing the results in the last ¼ wavelength of the pitch buffer, the process for a truly periodic signal generating the synthetic waveform can be used. Starting at sample B(−P), simply copy the samples from the pitch buffer to the synthetic buffer, rolling the pitch buffer pointer back to the start of the pitch period if the end of the pitch buffer is reached. Using this technique, a synthetic waveform of any duration can be generated. The pitch period to the left of the erasure start in the "Combined with OLAs" waveform of FIG. 11 corresponds to the updated contents of the pitch buffer.

The "Combined with OLAs" waveform demonstrates that the single period pitch buffer generates a periodic signal with period P, without discontinuities. This synthetic speech, generated from a single wavelength in the history buffer 240, is used to conceal the first 10 msec of an erasure. The effect of the OLA can be viewed by comparing the ¼ wavelength just before the erasure begins in the "Pitch Buffer" and "Combined with OLAs" waveforms. In step 730, this ¼ wavelength in the "Combined with OLAs" waveform also replaces the last ¼ wavelength in the history buffer 240.

The OLA operation with triangular windows can also be expressed mathematically. First we define the variable P4 to be ¼ of the pitch period in samples. Thus, P4=P>>2. In our example, P was 56, so P4 is 14. The OLA operation can then be expressed on the range $1 \leqq i \leqq P4$ as:

$$B[-i] = \frac{i}{P4}L[-i] + \left(\frac{P4-i}{P4}\right)B[-i-P]$$

The result of the OLA replaces both the last ¼ wavelengths in the history buffer 240 and the pitch buffer. By replacing the history buffer 240, the ¼ wavelength OLA transition will be output when the history buffer 240 is updated, since the history buffer 240 also delays the output by 3.75 msec. The output waveform during the first 10 msec of the erasure can be viewed in the region between the first two dotted lines in the "Concealed" waveform of FIG. 3.

In step 740, at the end of generating the synthetic speech for the frame, the current offset is saved into the pitch buffer as the variable O. This offset allows the synthetic waveform to be continued into the next frame for an OLA with the next frame's real or synthetic signal. O also allows the proper synthetic signal phase to be maintained if the erasure extends beyond 10 msec. In our example with 80 sample frames and P=56, at the start of the erasure the offset is −56. After 56 samples, it rolls back to −56. After an additional 80−56=24 samples, the offset is −56+24=−32, so O is −32 at the end of the first frame.

In step 745, after the synthesis buffer has been filled in from S[0] to S[79], S is used to update the history buffer 240. In step 750, the history buffer 240 also adds the 3.75 msec delay. The handling of the history buffer 240 is the same during erased and non-erased frames. At this point, the first frame concealing operation in step 535 of FIG. 5 ends and the process proceeds to step 540 in FIG. 5.

The details of how the FEC module 230 operates to conceal later frames beyond 10 msec, as shown in step 550 of FIG. 5, is shown in detail in FIG. 12. The technique used to generate the synthetic signal during the second and later erased frames is quite similar to the first erased frame, although some additional work needs to be done to add some variation to the signal.

In step 1205, the erasure code determines whether the second or third frame is being erased. During the second and third erased frames, the number of pitch periods used from the pitch buffer is increased. This introduces more variation in the signal and keeps the synthesized output from sounding too harmonic. As with all other transitions, an OLA is needed to smooth the boundary when the number of pitch periods is increased. Beyond the third frame (30 msecs of erasure) the pitch buffer is kept constant at a length of 3 wavelengths. These 3 wavelengths generate all the synthetic speech for the duration of the erasure. Thus, the branch on the left of FIG. 12 is only taken on the second and third erased frames.

Next, in step 1210, we increase the number of wavelengths used in the pitch buffer. That is, we set U=U+1.

Figure 13:
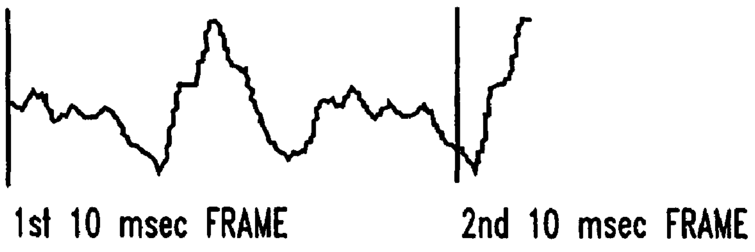
FIG. 13 illustrates synthesized signals continued into the second erased frame.

At the start of the second or third erased frame, in step 1215 the synthetic signal from the previous frame is continued for an additional ¼ wavelength into the start of the current frame. For example, at the start of the second frame the synthesized signal in our example appears as shown in FIG. 13. This ¼ wavelength will be overlap added with the new synthetic signal that uses older wavelengths from the pitch buffer.

At the start of the second erased frame, the number of wavelengths is increased to 2, U=2. Like the one wavelength pitch buffer, an OLA must be performed at the boundary where the 2-wavelength pitch buffer may repeat itself. This time the ¼ wavelength ending U wavelengths back from the tail of the pitch buffer, B, is overlap added with the contents of the last quarter buffer, L, in step 1220. This OLA operator can be expressed on the range $1 \leqq i \leqq P4$ as:

$$B[-i] = \frac{i}{P4}L[-i] + \left(\frac{P4-i}{P4}\right)B[-i-PU]$$

Figure 14:
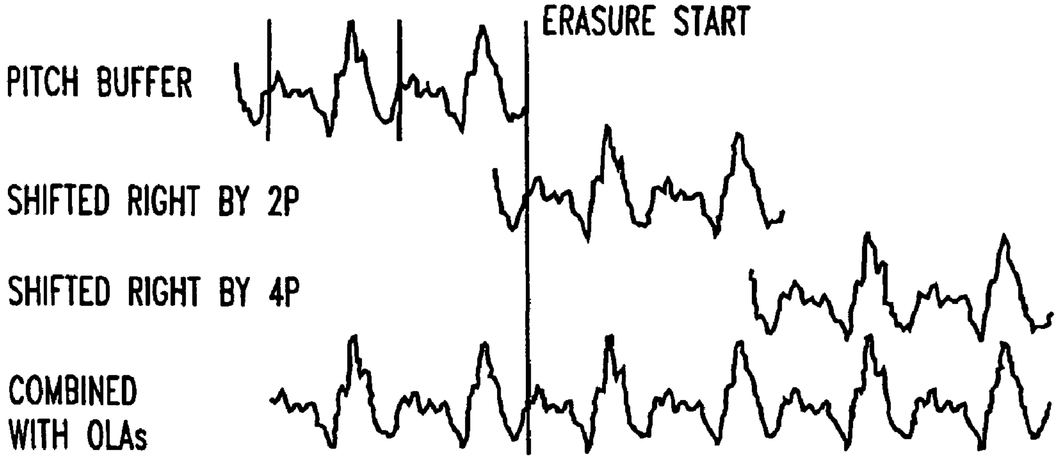
FIG. 14 illustrates synthetic signal generation using a two-period pitch buffer.

The only difference from the previous version of this equation is that the constant P used to index B on the right side has been transformed into PU. The creation of the two-wavelength pitch buffer is shown graphically in FIG. 14.

As in FIG. 11 the region of the "Combined with OLAs" waveform to the left of the erasure start is the updated contents of the two-period pitch buffer. The short vertical lines mark the pitch period. Close examination of the consecutive peaks in the "Combined with OLAs" waveform shows that the peaks alternate from the peaks one and two wavelengths back before the start of the erasure.

At the beginning of the synthetic output in the second frame, we must merge the signal from the new pitch buffer with the ¼ wavelength generated in FIG. 13. We desire that the synthetic signal from the new pitch buffer should come from the oldest portion of the buffer in use. But we must be careful that the new part comes from a similar portion of the waveform, or when we mix them, audible artifacts will be created. In other words, we want to maintain the correct phase or the waveforms may destructively interfere when we mix them.

This is accomplished in step 1225 (FIG. 12) by subtracting periods, P, from the offset saved at the end of the previous frame, O, until it points to the oldest wavelength in the used portion of the pitch buffer.

For example, in the first erased frame, the valid index for the pitch buffer, B, was from −1 to −P. So the saved O from the first erased frame must be in this range. In the second erased frame, the valid range is from −1 to −2P. So we subtract P from O until O is in the range −2P<=O<−P. Or to be more general, we subtract P from O until it is in the range −UP<=O<−(U−1)P. In our example, P=56 and O=−32 at end of the first erased frame. We subtract 56 from −32 to yield −88. Thus, the first synthesis sample in the second frame comes from B[−88], the next from B[−87], etc.

Figure 15:
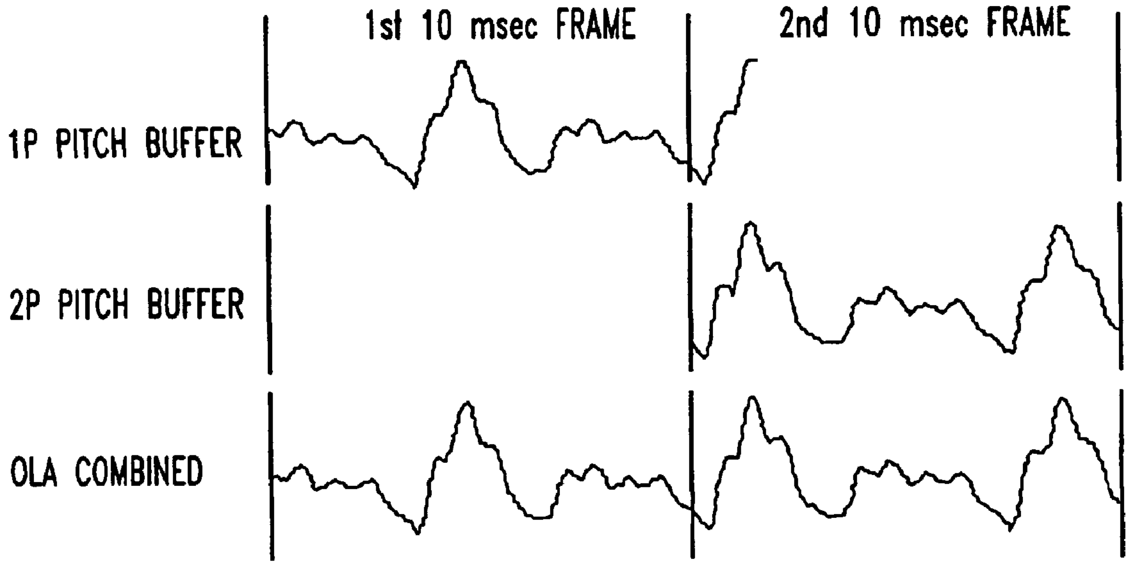
FIG. 15 illustrates an OLA at the start of the second erased frame.

The OLA mixing of the synthetic signals from the one— and two—period pitch buffers at the start of the second erased frame is shown in FIG. 15.

It should be noted that by subtracting P from O, the proper waveform phase is maintained and the peaks of the signal in the "1P Pitch Buffer" and "2P Pitch Buffer" waveforms are aligned. The "OLA Combined" waveform also shows a smooth transition between the different pitch buffers at the start of the second erased frame. One more operation is required before the second frame in the "OLA Combined" waveform of FIG. 15 can be output.

In step 1230 (FIG. 12), the new offset is used to copy ¼ wavelength from the pitch buffer into a temporary buffer. In step 1235, ¼ wavelength is added to the offset. Then, in step 1240, the temporary buffer is OLA'd with the start of the output buffer, and the result is placed in the first ¼ wavelength of the output buffer.

In step 1245, the offset is then used to generate the rest of the signal in the output buffer. The pitch buffer is copied to the output buffer for the duration of the 10 msec frame. In step 1250, the current offset is saved into the pitch buffer as the variable O.

During the second and later erased frames, the synthetic signal is attenuated in step 1255, with a linear ramp. The synthetic signal is gradually faded out until beyond 60 msec it is set to 0, or silence. As the erasure gets longer, the concealed speech is more likely to diverge from the true signal. Holding certain types of sounds for too long, even if the sound sounds natural in isolation for a short period of time, can lead to unnatural audible artifacts in the output of the concealment process. To avoid these artifacts in the synthetic signal, a slow fade out is used. A similar operation is performed in the concealment processes found in all the standard speech coders, such as G.723.1, G.728, and G.729.

The FEC process attenuates the signal at 20% per 10 msec frame, starting at the second frame. If S, the synthesis buffer, contains the synthetic signal before attenuation and F is the number of consecutive erased frames (F=1 for the first erased frame, 2 for the second erased frame) then the attenuation can be expressed as:

$$S'[i] = \left[1 - .2(F-2) - \frac{.2i}{80}\right]S[i]$$

In the range $0 \leqq i \leqq 79$ and $2 \leqq F \leqq 6$. For example, at the samples at the start of the second erased frame F=2, so F−2=0 and 0.2/80=0.0025, so S'[0]=1.S[0], S'[1]=0.9975S[1], S'[2]=0.995S[2], and S'[79]=0.8025S[79]. Beyond the sixth erased frame, the output is simply set to 0.

After the synthetic signal is attenuated in step 1255, it is given to the history buffer 240 in step 1260 and the output is delayed, in step 1265, by 3.75 msec. The offset pointer O is also updated to its location in the pitch buffer at the end of the second frame so the synthetic signal can be continued in the next frame. The process then goes back to step 540 to get the next frame.

Figure 17:
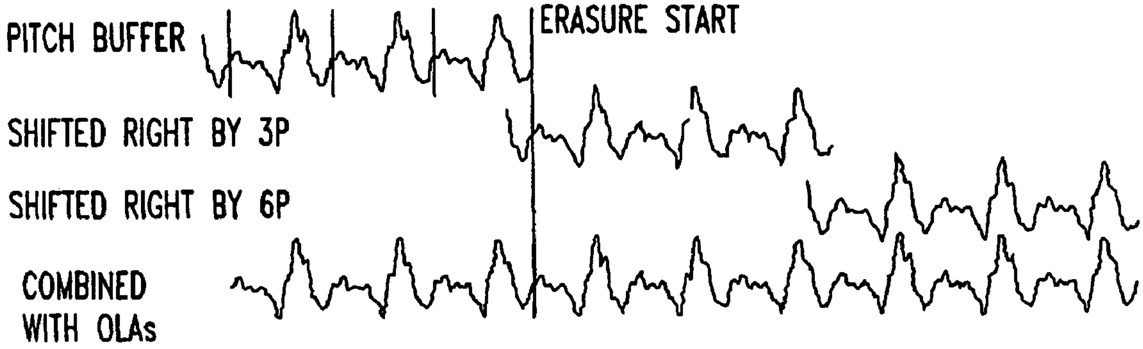
FIG. 17 illustrates synthetic signal generation using a three-period pitch buffer.

If the erasure lasts beyond two frames, the processing on the third frame is exactly as in the second frame except the number of periods in the pitch buffer is increased from 2 to 3, instead of from 1 to 2. While our example erasure ends at two frames, the three-period pitch buffer that would be used on the third frame and beyond is shown in FIG. 17. Beyond the third frame, the number of periods in the pitch buffer remains fixed at three, so only the path on right side of FIG. 12 is taken. In this case, the offset pointer O is simply used to copy the pitch buffer to the synthetic output and no overlap add operations are needed.

Figure 16:
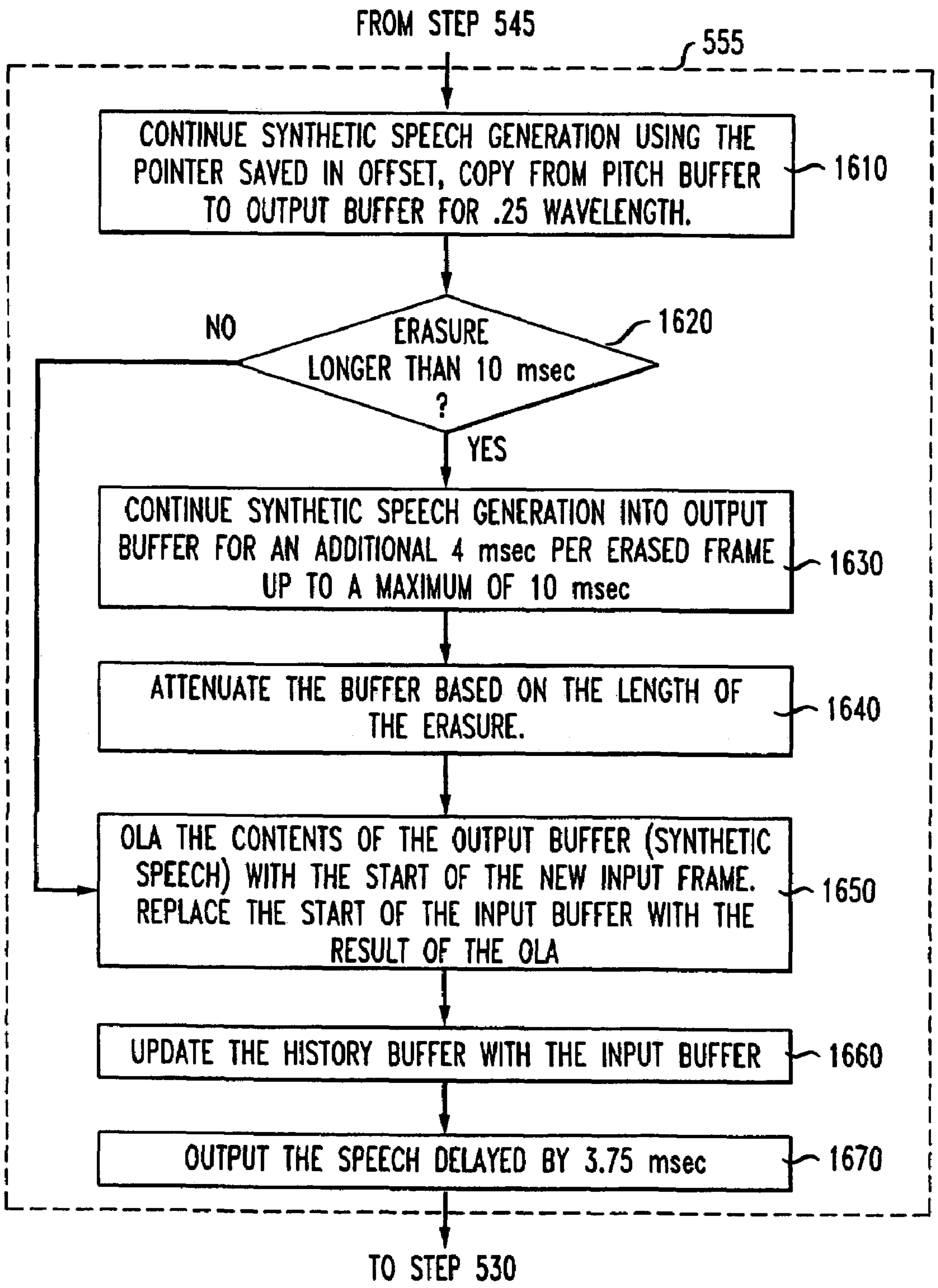
FIG. 16 is a flowchart of an exemplary method for processing the first frame after the erasure.

The operation of the FEC module 230 at the first good frame after an erasure is detailed in FIG. 16. At the end of an erasure, a smooth transition is needed between the synthetic speech generated during the erasure and the real speech. If the erasure was only one frame long, in step 1610, the synthetic speech for ¼ wavelength is continued and an overlap add with the real speech is performed.

If the FEC module 230 determines that the erasure was longer than 10 msec in step 1620, mismatches between the synthetic and real signals are more likely, so in step 1630, the synthetic speech generation is continued and the OLA window is increased by an additional 4 msec per erased frame, up to a maximum of 10 msec. If the estimate of the pitch was off slightly, or the pitch of real speech changed during the erasure, the likelihood of a phase mismatch between the synthetic and real signals increases with the length of the erasure. Longer OLA windows force the synthetic signal to fade out and the real speech signal to fade in more slowly. If the erasure was longer than 10 msec, it is also necessary to attenuate the synthetic speech, in step 1640, before an OLA can be performed, so it matches the level of the signal in the previous frame.

In step 1650, an OLA is performed on the contents of the output buffer (synthetic speech) with the start of the new input frame. The start of the input buffer is replaced with the result of the OLA. The OLA at the end of the erasure for the example above can be viewed in FIG. 4. The complete output of the concealment process for the above example can be viewed in the "Concealed" waveform of FIG. 3.

In step 1660, the history buffer is updated with the contents of the input buffer. In step 1670, the output of the speech is delayed by 3.75 msec and the process returns to step 530 in FIG. 5 to get the next frame.

With a small adjustment, the FEC process may be applied to other speech coders that maintain state information between samples or frames and do not provide concealment, such as G.726. The FEC process is used exactly as described in the previous section to generate the synthetic waveform during the erasure. However, care must be taken to insure the coder's internal state variables track the synthetic speech generated by the FEC process. Otherwise, after the erasure is over, artifacts and discontinuities will appear in the output as the decoder restarts using its erroneous state. While the OLA window at the end of an erasure helps, more must be done.

Figure 18:
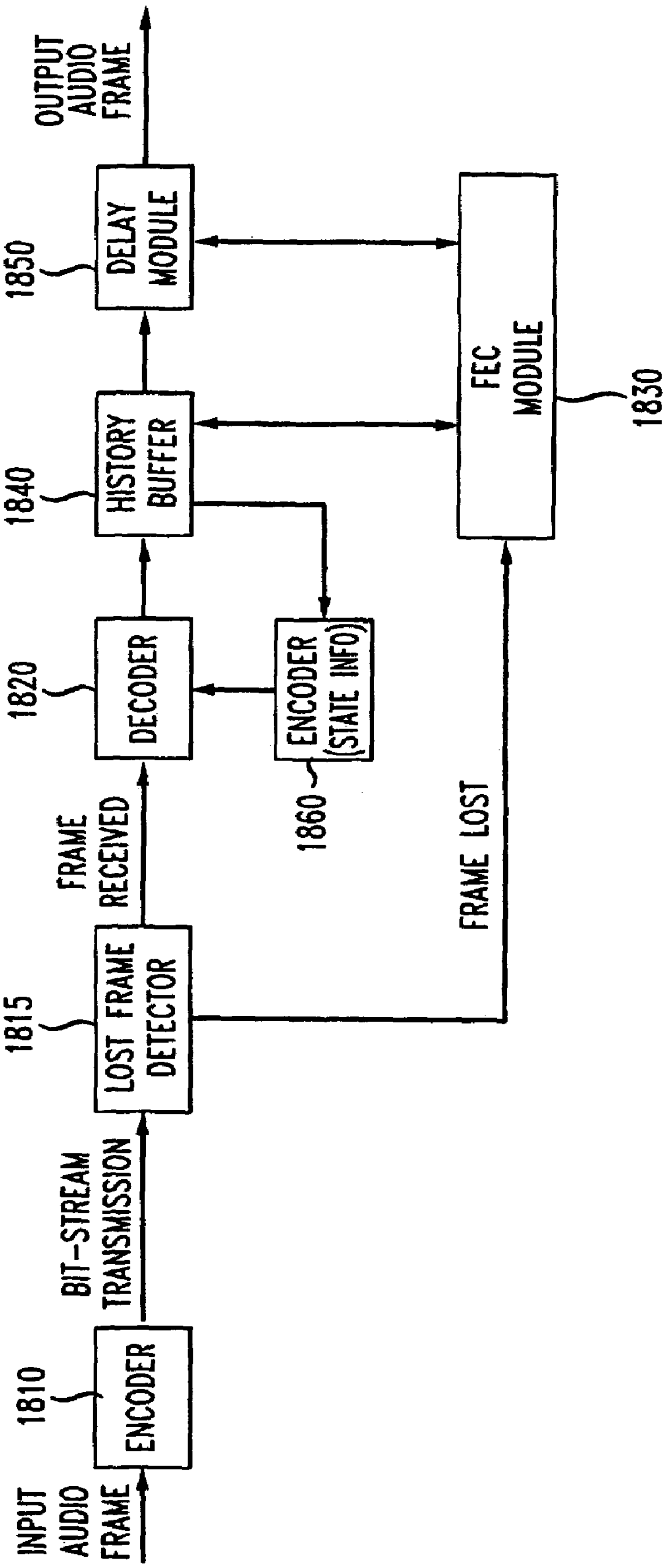
FIG. 18 is a block diagram that illustrates the use of FEC techniques with other speech coders.

Better results can be obtained as shown in FIG. 18, by converting the decoder 1820 into an encoder 1860 for the duration of the erasure, using the synthesized output of the FEC module 1830 as the encoder's 1860 input.

This way the decoder 1820's variables state will track the concealed speech. It should be noted that unlike a typical encoder, the encoder 1860 is only run to maintain state information and its output is not used. Thus, shortcuts may be taken to significantly lower its run-time complexity.

As stated above, there are many advantages and aspects provided by the invention. In particular, as a frame erasure progresses, the number of pitch periods used from the signal history to generate the synthetic signal is increased as a function of time. This significantly reduces harmonic artifacts on long erasures. Even though the pitch periods are not played back in their original order, the output still sounds natural.

With G.726 and other coders that maintain state information between samples or frames, the decoder may be run as an encoder on the output of the concealment process' synthesized output. In this way, the decoder's internal state variables will track the output, avoiding—or at least decreasing—discontinuities caused by erroneous state information in the decoder after the erasure is over. Since the output from the encoder is never used (its only purpose is to maintain state information), a stripped-down low complexity version of the encoder may be used.

The minimum pitch period allowed in the exemplary embodiments (40 samples, or 200 Hz) is larger than what we expect the fundamental frequency to be for some female and children speakers. Thus, for high frequency speakers, more than one pitch period is used to generate the synthetic speech, even at the start of the erasure. With high fundamental frequency speakers, the waveforms are repeated more often. The multiple pitch periods in the synthetic signal make harmonic artifacts less likely. This technique also helps keep the signal natural sounding during un-voiced segments of speech, as well as in regions of rapid transition, such as a stop.

The OLA window at the end of the first good frame after an erasure grows with the length of the erasure. With longer erasures, phase matches are more likely to occur when the next good frame arrives. Stretching the OLA window as a function of the erasure length reduces glitches caused by phase mismatches on long erasure, but still allows the signal to recover quickly if the erasure is short.

The FEC process of the invention also uses variable length OLA windows that are a small fraction of the estimated pitch that are ¼ wavelength and are not aligned with the pitch peaks.

The FEC process of the invention does not distinguish between voiced and un-voiced speech. Instead it performs well in reproducing un-voiced speech because of two attributes of the process: (A) The minimum window size is reasonably large so even un-voiced regions of speech have reasonable variation, and (B) The length of the pitch buffer is increased as the process progresses, again insuring harmonic artifacts are not introduced. It should be noted that using large windows to avoid handling voiced and unvoiced speech differently is also present in the well-known time-scaling technique WSOLA.

While the adding of the delay of allowing the OLA at the start of an erasure may be considered as an undesirable aspect of the process of the invention, it is necessary to insure a smooth transition between real and synthetic signals at the start of the erasure.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A method of performing Frame Erasure Concealment (FEC) for a speech coder that does not have FEC capability, comprising:

receiving encoded frames of compressed speech information transmitted from an encoder;

determining if an encoded frame is erased, lost or corrupted in transmission, decoding the received encoded frames into decoded frames if the determining step determines that the encoded frame is not erased;

generating a synthetic frame for the erased frame using data of previously decoded frames if the determining step determines that the encoded frame is erased;

updating a first memory with data of the decoded and synthetic frames; and outputting the decoded and synthetic frames as audio signals wherein the generating step at the first erased frame in a sequence of one or more erased frames comprises:

estimating a pitch period of the erased frame;

copying one or more of most recent pitch periods from the first memory to a second memory;

copying a portion of the most recent pitch period from the first memory to a third memory;

overlap adding the third memory with a portion of a pitch period stored in the second memory;

storing the overlap added portion of the pitch period in the most recent portion the second memory;

generating a synthetic frame based on one or more of the most recent pitch periods stored in the second memory, for updating the first memory in the updating step and output in the outputting step; and storing in an offset pointer the last location in the second memory used in the generating step.

2. The method of claim 1, further comprising: updating the delay memory with the overlap added portion.

3. The method of claim 1, wherein the estimating step uses autocorrelation for the pitch period estimate if the decoder does not maintain a pitch estimate, and the decoder's pitch estimate is used if the decoder does maintain the pitch estimate.

4. A method of performing Frame Erasure Concealment (FEC) for a speech coder that does not have FEC capability, comprising:

receiving encoded frames of compressed speech information transmitted from an encoder;

determining if an encoded frame is erased, lost or corrupted in transmission, decoding the received encoded frames into decoded frames if the determining step determines that the encoded frame is not erased;

generating a synthetic frame for the erased frame using data of previously decoded frames if the determining step determines that the encoded frame is erased;

updating a first memory with data of the decoded and synthetic frames; and outputting the decoded and synthetic frames as audio signals; and determining whether one or more subsequent encoded frames are erased after a synthetic frame is output, in which case determining whether the number of consecutive erased frames exceeds a predetermined length;

modifying number of pitch periods used to generate the synthetic frame if the determining step determines that number of consecutive erased frames does not exceed a predetermined length; and continuing the synthetic frame generation with a current number of pitch periods if the determining step determines that the number of consecutive erased frames exceeds a said predetermined length.

5. The method of claim 4, wherein if the number of consecutive erased frames does not exceed said predetermined length, the modifying step further comprises:

continuing the generation of the synthetic signal from previous frame for a portion of a pitch period and placing result of said generation into a fourth memory;

increasing number of pitch periods used in a second memory;

overlap adding information of the third memory with a portion of a pitch period stored in the second memory and storing result of said overlap adding in a most recent portion of the second memory;

moving an offset pointer by pitch periods until it points to a new portion of the second memory;

generating a synthetic frame's worth of data by copying data from the second memory to a fifth memory;

storing in an offset pointer last location in the second memory used in the generating step;

overlap adding information of the fourth memory with a portion of a pitch period in the fifth memory and storing result in the fifth memory;

determining if the erased frames exceed a predetermined length; and attenuating the fifth memory based on length of the erasure if the determining step determines that the erased frames exceed said predetermined length, the fifth memory being used for updating the first memory in the updating step and outputting in the outputting step.

6. The method of claim 4, wherein if the number of consecutive erased frames does exceed a predetermined length the continuing step further comprises:

generating a synthetic frame's worth of data by copying data from the second memory to a fifth memory;

storing in an offset pointer the last location in the second memory used in the generating step;

determining if the erased frames exceed said predetermined length; and attenuating the fifth memory based on length of the erasure if the determining step determines the erased frames exceed said predetermined length, the fifth memory being used for updating the first memory in the updating step and outputting in the outputting step.

7. The method of claim 4, wherein the first memory is a history buffer, the second memory is a pitch buffer, the third memory is a last quarter buffer, the fourth memory is a temporary buffer, and the fifth memory is an output buffer.

8. A method of performing Frame Erasure Concealment (FEC) for a speech coder that does not have FEC capability, comprising:

receiving encoded frames of compressed speech information transmitted from an encoder;

determining if an encoded frame is erased, lost or corrupted in transmission, decoding the received encoded frames into decoded frames if the determining step determines that the encoded frame is not erased;

generating a synthetic frame for the erased frame using data of previously decoded frames if the determining step determines that the encoded frame is erased;

updating a first memory with data of the decoded and synthetic frames; and outputting the decoded and synthetic frames as audio signals; and determining whether one or more subsequent encoded frames are erased after a synthetic frame is output, and when that is not the case processing the first non-erased encoded frame using an FEC process;

generating a synthetic frame's worth of data by copying data from the second memory to a fifth memory;

determining if the erased frames exceed a predetermined length;

attenuating the fifth memory based on the length of the erasure if the determining step determines the erased frames exceed a predetermined length;

overlap adding a portion of the fifth memory with the start of first non-erased decoded frame and storing the result in the fifth memory; and copying the non-overlap added region of the decoded frame to the fifth memory, the fifth memory being used to update the first memory in the updating step and outputting in the outputting step.

9. The method of claim 8, wherein a length of the overlap added increases with the length of the erased frames.

10. An apparatus of performing Frame Erasure Concealment (FEC) for a speech coder that does not have FEC capability, comprising:

a lost frame detector tat receives encoded frames of compressed speech information transmitted from an encoder and determines if an encoded frame is missing, lost or corrupted in transmission;

a decoder that decodes the received encoded frames into decoded frames if the lost frame detector determines that the encoded frame is not erased;

an FEC module that generates a synthetic frame for the erased frame using data of previously decoded frames if the lost frame detector determines that the encoded frame is erased;

a first memory that is updated with data of the decoded and synthetic frames; and an output device that outputs the decoded synthetic frames as audio signals wherein the lost frame detector determines if one or more subsequently encoded frames are erased after a synthetic frame is output, and wherein if the lost frame detector determines that one or more subsequently encoded frames are erased, the FEC module determines if the number of consecutive erased frames exceeds a predetermined length, modifies the number of pitch periods used to generate the synthetic frame if the number of consecutive erased frames is determined not to exceed a predetermined length, and continues the synthetic frame generation with the current number of pitch if the number of consecutive erased frames is determined to exceed a predetermined length.

11. The apparatus of claim 10, wherein if the FEC module determines that the number of consecutive erased frames does not exceed a predetermined length, the FEC module continues the generation of the synthetic signal from the previous frame for a portion of a pitch period and places the result into a fourth memory, increases the number of pitch periods used in a second memory, overlap adds the third memory with a portion of a pitch period stored in the second memory and stores the result in the most recent portion of the second memory, moves the offset pointer by pitch periods until it points to the new portion of the second memory, generates a synthetic frame's worth of data by copying data from the second memory to a fifth memory, stores in an offset pointer the last location used in the second memory, overlap adds the fourth memory with a portion of a pitch period in the fifth memory and stores the result in the fifth memory, determines if the missing frames exceed a predetermined length, attenuates the fifth memory based on the length of the erasure if the missing frames are determined to exceed a predetermined length, the fifth memory being used for updating the first memory and outputting using the output device.

12. The apparatus of claim 10, wherein if the FEC module determines that the number of consecutive erased frames does exceed a predetermined length, the FEC module generates a synthetic frame's worth of data by copying data from the second memory to a fifth memory, stores in an offset pointer the last location used in the second memory, determines if the missing frames exceed a predetermined length, attenuates the fifth memory based on the length of the erasure if the missing frames are determined to exceed a predetermined length, the fifth memory being used for updating the first memory and outputting using the output device.

13. The apparatus of claim 10, wherein the first memory is a history buffer, the second memory is a pitch buffer, the third memory is a lastquarter buffer, the fourth memory is a temporary buffer, and the fifth memory is an output buffer.

* * * * *

UNITED STATES PATENT AND TRADEMARK OFFICE

CERTIFICATE OF CORRECTION

PATENT NO. : 7,233,897 B2
APPLICATION NO. : 11/170313
DATED : June 19, 2007

INVENTOR(S) : David A. Kapilow

It is certified that error appears in the above-identified patent and that said Letters Patent is hereby corrected as shown below:

Claim 1: col. 15, line 7: a new line that is out-dented precedes the word “wherein,” creating a “wherein” clause that encompasses the 7 clauses that follow.

Claim 4, col. 15, line 51: add a colon after “case”

Claim 4, col. 15, line 61: delete “a”

Claim 5, col. 15, line 66: change “frame” to --frames--

Claim 5, col. 16, line 11: insert --the-- between “pointer” and “last”

Claim 8, col. 16, line 64-65: remove the line break between “the” and “second”

Claim 8, col. 16, line 61: add a colon after “case”, and begin a new indented line with the “processing” clause Claim 8, col. 17, line 3: change “a” to --said--

Claim 8, col. 17, line 5: insert --the-- between “of” and “first”

Claim 8, col. 17, line 9: change “to update” to --for updating--

Claim 9, col. 17, line 11: change “a” to --the--

Claim 9, col. 17, line 12: change “added” to --add-- (or insert --portion-- after “added”)

Claim 10, col. 17, line 13: change “of” to --for--

Claim 10, col. 17, line 16: change “tat” to --that--

Claim 10, col. 17, line 40: change “a” to --said--

Claim 10, col. 17, line 42: insert --periods-- after “pitch”

Claim 10, col. 17, line 43: change “a” to --said--

Claim 11, col. 18, line 20: insert --and-- before “attenuates”

Claim 12, col. 18, line 33: insert --and-- before “attenuates”

UNITED STATES PATENT AND TRADEMARK OFFICE

CERTIFICATE OF CORRECTION

PATENT NO. : 7,233,897 B2

APPLICATION NO. : 11/170313

DATED : June 19, 2007

INVENTOR(S) : David A. Kapilow

It is certified that error appears in the above-identified patent and that said Letters Patent is hereby corrected as shown below:

Claim 13, col. 18, line 41: change “lastquarter” to --last quarter--

Signed and Sealed this

Fourth Day of September, 2007

JON W. DUDAS

*Director of the United States Patent and Trademark Office*

UNITED STATES PATENT AND TRADEMARK OFFICE

CERTIFICATE OF CORRECTION

PATENT NO. : 7,233,897 B2
APPLICATION NO. : 11/170313
DATED : June 19, 2007
INVENTOR(S) : David A. Kapilow It is certified that error appears in the above-identified patent and that said Letters Patent is hereby corrected as shown below:

Col. 1 lines 5-8 Please amend the first sentence of the patent to read as follows:

This non-provisional application is a continuation of, and it claims priority from, non-provisional application 09/700,524, which corresponds to 35 USC 371 PCT/US00/10576 application filed April 19, 2000, now US Patent 6,952,668, issued October 4, 2005, which claims the benefit of U.S. Provisional application 60/130,016, filed April 19, 1999, the subject matter of which is incorporated herein by reference.

Signed and Sealed this

Twenty-eighth Day of September, 2010

David J. Kappos

David J. Kappos
*Director of the United States Patent and Trademark Office*